United States Patent [19]

Zwan

[11] 4,251,679

[45] Feb. 17, 1981

[54] ELECTROMAGNETIC RADIATION TRANSDUCER

[75] Inventor: Bryan J. Zwan, Los Angeles, Calif.

[73] Assignee: E-Cel Corporation, Houston, Tex.

[21] Appl. No.: 21,429

[22] Filed: Mar. 16, 1979

Related U.S. Application Data

[63] Continuation of Ser. No. 907,055, May 17, 1978, abandoned.

[51] Int. Cl.² .......................................... H01L 31/06
[52] U.S. Cl. ................................ 136/244; 322/2 R;
310/300; 136/252; 136/254
[58] Field of Search .............. 136/89 R, 89 P, 89 CR,
136/89 SP, 89 RT; 250/211 R, 211J, 212;
357/29, 30; 322/2 R; 310/300, 321

[56] References Cited

U.S. PATENT DOCUMENTS

| | | | |
|---|---|---|---|
| 2,789,193 | 4/1957 | Anderson | 201/63 |
| 2,904,612 | 9/1959 | Regnier | 136/89 |
| 2,962,539 | 11/1960 | Daniel | 136/89 |
| 3,150,999 | 9/1964 | Rudenberg et al. | 136/89 |
| 3,152,926 | 10/1964 | Power | 136/89 |
| 3,229,682 | 1/1966 | Perlmutter et al. | 126/270 |
| 3,232,795 | 2/1966 | Gillette | 136/89 |
| 3,263,101 | 7/1966 | Geer | 310/4 |
| 3,310,439 | 3/1967 | Seney | 136/89 |
| 3,350,234 | 10/1967 | Ule | 136/89 |
| 3,427,200 | 2/1969 | Lapin et al. | 136/89 |
| 3,475,609 | 10/1969 | Schneider | 250/199 |
| 3,500,135 | 3/1970 | Li | 317/234 |
| 3,760,257 | 9/1973 | Fletcher et al. | 321/1.5 |
| 3,824,448 | 7/1974 | DeRivas | 322/2 |
| 3,985,579 | 10/1976 | Rahilly | 136/89 |
| 4,004,210 | 1/1977 | Yater | 322/2 R |
| 4,019,113 | 4/1977 | Hartman | 321/1.5 |
| 4,039,352 | 8/1977 | Marinescu | 136/205 |
| 4,046,594 | 9/1977 | Tarui et al. | 136/89 SJ |
| 4,094,703 | 6/1978 | Williams | 136/89 TF |
| 4,094,751 | 6/1978 | Nozik | 204/80 |

OTHER PUBLICATIONS

B. Fan et al., "Nonlinear Optical Response of Metal–Barrier–Metal Junctions," *Applied Physics Letters*, vol. 30, pp. 177–179 (1977).

R.K. Jain et al., "Direct Observation of the Optical Plasma Resonance of Ag by Photon-Assisted Tunneling," *Phys. Rev. Lett.*, vol. 36, pp. 435–438, (1976).

*Primary Examiner*—Aaron Weisstuch
*Attorney, Agent, or Firm*—Cushman, Darby & Cushman

[57] ABSTRACT

Electromagnetic radiation is converted to usable power in the form of electrical current by means of a plurality of transducing cavities having a wall structure that is inclined inwardly to receive impinging radiation and includes potential barrier strips each having different conduction electron densities which are also different from the conduction electron density of the material constituting the wall structure of each cavity; each potential barrier strip extends from the mouth of the cavity to the base thereof and, at the mouth, is connected to a conductor having a preselected conduction electron density whereby radiation impinging on a cavity will induce current flow which will be rectified across the potential barriers; the cavities are connected in parallel so that current can be delivered to a load connected across the conductors.

27 Claims, 5 Drawing Figures

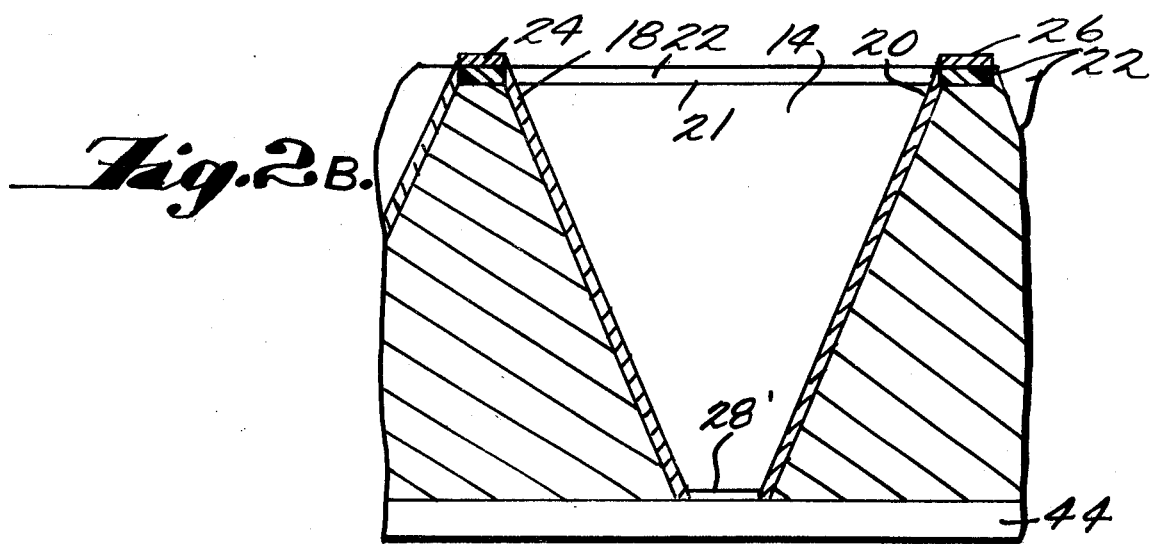
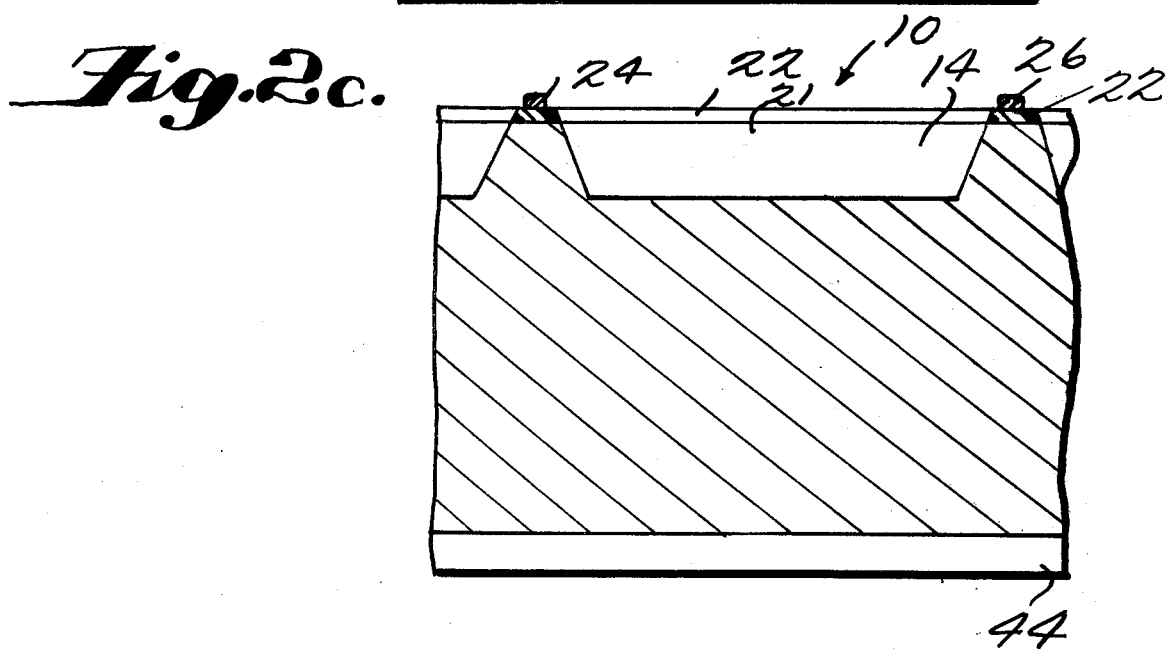
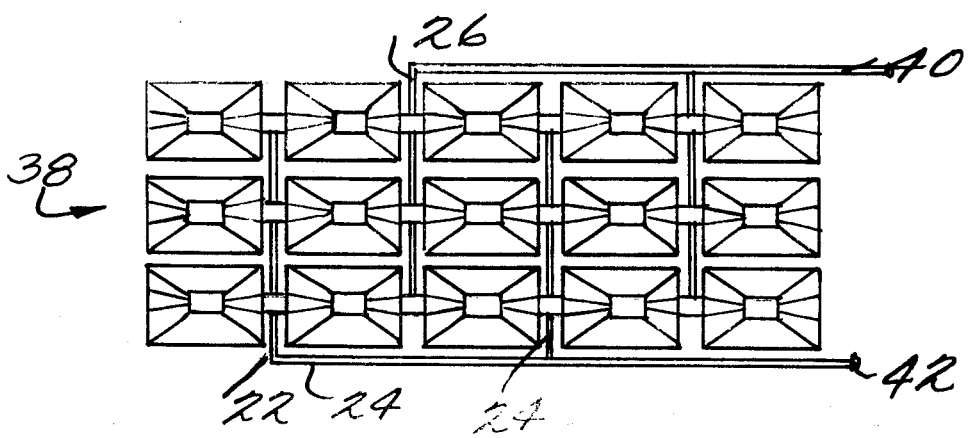

ELECTROMAGNETIC RADIATION TRANSDUCER

This is a continuation, of application Ser. No. 907,055 filed May 17, 1978, abandoned.

BACKGROUND AND BRIEF SUMMARY OF THE INVENTION

The present invention relates generally to devices for the conversion of electromagnetic radiation into electric power and, more particularly, to the conversion of solar radiation into electric current.

Devices for converting or transducing electromagnetic radiation to electric power have been extensively investigated and, in view of the increaasing costs of fossil fuels, attempts have been directed to improving the efficiency of solar transducers with the goal of increasing the range of applications of such devices.

The most commonly utiilized device for conversion of radiant energy into electric power is known as the solar cell and which consists of the juxtaposition of materials of different electrical conductivities to form a rectifying junction which will result in the generation of current in response to exposure to solar radiation. Typically, most solar cells have a single P/N junction formed from oppositely doped semi-conductor material.

The solar cells of the prior art are responsive to only a portion of the energy extant in the solar spectrum and thus have a limited capability to convert broad band electromagnetic radiation into electric power. The major energy loss as a result of this limitation is believed to be approximately 50%. In addition, other losses are known to be caused by the structure of the solar cells and the particular arrangement and types of materials used to construct the cells.

It is the object of the present invention to provide a novel solar cell which will exhibit enhanced efficiencies in converting incident radiation, particularly solar radiation, to electric power, relative to what was obtainable by the devices of the prior art.

It has been the practice to select materials for solar cells where the amount of incident light quanta that is converted to electrical energy is maximized relative to the heat losses. That this was necessary can be appreciated from the following explanation.

Impinging light quanta of a specific wavelength can, through excitation of the solar cell material, make available for conduction an electron-hole pair. If an electron-hole pair is created near the junction, charge separation occurs and, if collected, current is generated. The electron-hole pair creation occurs over a broad band of wavelengths of the incident solar radiation, but it is required that the energy of the electromagnetic quantum be greater than or equal to the energy difference between the conduction band and the valence band of the material to create the electron-hole pair. However, for a given quantum, only an amount of energy equal to the band gap, that is, the difference between the conduction band and valence band energy levels, is converted to an electron-hole pair and any energy in excess of the band gap value is converted into heat. Light quanta with energies below the band gap value excite no electron-hole pairs. Use of material in solar cells with a small band gap relative to the incident electromagnetic spectrum increases the relative amount of energy available for absorption but also increases the relative loss of energy due to heating. As the band gap decreases, the heat loss increases, thereby limiting the selection of material that can be used to optimize the power output versus the heat losses of a given solar cell.

As a result of the foregoing, the solar cells of the prior art have been so constructed as to convert only a narrow range of incident solar radiation to electric power, thus reducing their energy conversion efficiency.

It is also known that in presently available solar cells, the power output of the cells is an indication of the depth to which the incident quanta penetrate before they are absorbed. This is so since, for charge separation of an electron-hole pair, absorption of quanta must occur near a junction. As a result, it has been necessary to improve the physical design of the junction in terms of its profile in order to improve the conversion factor of the cell. However, such requirements are both difficult and expensive in view of the types of materials that can be used relative to their absorption characteristics.

In constructing solar cells, another important factor has been the criticality of the condition of the material that is used in the construction of the cell. As the output power of a solar cell is derived only from charged carriers which reach the collection electrode, any photocarrier recombination is a loss which diminishes the cell's overall efficiency. As photocarriers diffuse towards the electrode, they encounter a series resistance which must be kept low for nominal energy conversion. Thus, the most efficient devices must be fabricated from extremely pure and defect-free single crystals of low resistivity in order to enhance the photocarrier lifetime and to reduce the series resistance. However, the manufacture of such crystals at present is very expensive, thus limiting the commercial market for this type of power source.

There are other factors which adversely affect the efficiencies of solar cells, such as the temperature, the saturation or dark current, and junction losses which, alone, account for between 38% and 45% loss in output voltage of silicon cells.

To overcome these losses, attempts have been made to improve the character and quality of the materials employed in the construction of the cells as well as their arrangement, but efficiencies higher than 22%, it is believed, can only be achieved at great expense.

The solar radiation transducer module of the present invention overcomes the foregoing disadvantages while providing a solar radiation module or cell which will exhibit improved performance in converting broad band electromagnetic radiation to useful electric energy at greater efficiencies than heretofore available.

In particular, the structure of the cell or module of the present invention is such that incident radiation will be absorbed and transduced in resonance with the frequency of the impinging quanta by using cavities formed on a substrate of specific shape and dimension and with a specific junction profile. With the arrangement of the present invention, quanta of different wavelengths and total energy will be available for conversion to electrical energy which, heretofore, was either lost by absorption or by heat losses.

Of particular interest is the fact that the structure and material or group of materials used in the transducer module of the present invention will not require pure, single, defect-free crystals for energy conversion, but, instead, the present invention utilizes materials that are shaped to match a characteristic of the incident radiation, thereby minimizing junction profiling losses that have been encountered in prior art structures.

In a preferred embodiment, an electromagnetic radiation transducer module is provided which consists of a plurality of cavities formed on a substrate where each cavity has an inwardly sloping wall structure. Situated on or as a part of the inwardly sloping wall of each cavity are one or more potential barrier strips of dissimilar material. The strips extend from the mouth of the cavity to the base thereof to divide the interior of the cavity into two surface areas. The walls of the cavity may be of one material such as aluminum, where the potential barrier strips are of two dissimilar materials having different work functions or conduction band electron densities or concentrations. At the edges of each strip there is created a potential barrier which exhibits non-linear, current-voltage characteristics. At the mouth of the cavities, the strips are connected to conductors or electrodes having specific work functions or conduction electron density characteristics. The cavities of a module may be connected in series or parallel with one another to suit the specific application of the module.

The dimensions of the cavity are selected so that the mouth of the cavity will admit radiation corresponding to roughly the longest wavelength in the solar spectrum while the base of the cavity has dimensions which are on the order of or smaller than the shortest wavelength, approximately, in the solar spectrum. The cavities are electrically insulated from each other except through the electrodes connected to the potential barrier strips.

With this arrangement, the cavities can be made extremely shallow so that the resulting module can be constructed on a flexible substrate. Further, it is no longer necessary to use extremely pure, defect-free single crystal material, thus resulting in a considerable saving in the cost of manufacturing the modules. Further, the efficiency, in terms of the transducing function of the module, will be relatively high compared to what was available in the prior art and yet will provide a high ratio of output wattage to the weight of the module.

These and other objects and advantages of the present invention will become apparent as consideration is given to the following detailed description which is given in conjunction with the accompanying drawings, in which:

BRIEF DESCRIPTION OF THE DRAWINGS

FIG. 2B is a view taken along line 2B—2B of FIG. 1;

FIG. 2C is a view taken along line 2C—2C of FIG. 1; and

FIG. 3 is a schematic illustration of a plurality of cavities of the present invention connected in parallel.

DETAILED DESCRIPTION OF THE INVENTION

Figure 1:
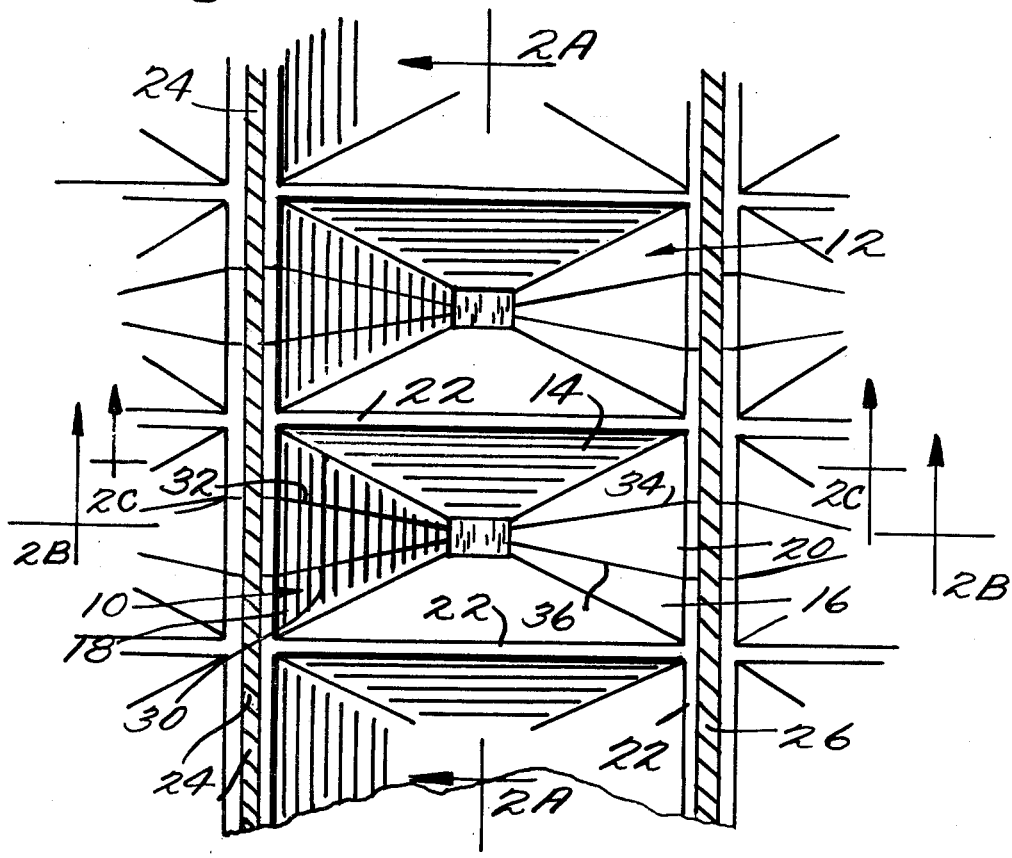
FIG. 1 is a plan view of a portion of a module of the present invention having a plurality of cavities with two of such cavities being illustrated.

Referring now to FIG. 1, there is shown a portion of a transducing module which consists of a plurality of juxtaposed cavities, two of which are indicated at 10 and 12. In the illustrated embodiment, each of the cavities is in the shape of an inverted, truncated pyramid having inwardly sloping side walls but it should be understood that all that is required is that the mouth of each cavity be symmetrical about a central axis of each cavity and that the area enclosed by the side walls decreases as the depth of the cavity increases. Thus, the cavities can also be shaped as hemiellipsoids or as hemispheres.

In a preferred embodiment, the side wall or interior surface of each cavity is divided into two sections 14 and 16 by two strips of dissimilar material 18 and 20. The wall sections 14 and 16 are made from or coated with a material having a given work function $\phi_1$ or conduction electron density which may be represented by the symbol $N_1$. The term work function as employed herein means the minimun energy necessary for an electron to escape into vacuum from an initial energy level. It is usually more accurately measurable than the conduction electron density of a material. The strips 18 and 20 are each made from or coated with a material having different work functions $\phi_2$ and $\phi_3$ or conduction electron densities which are here represented by the symbols $N_2$ and $N_3$, respectively.

Figure 2A:
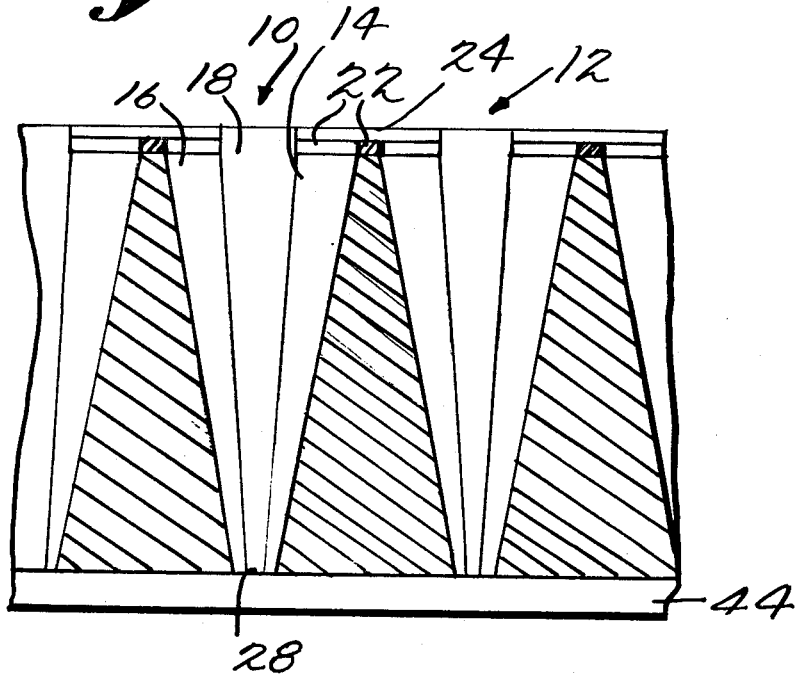
FIG. 2A is a sectional view taken along line 2A—2A of FIG. 1.

As shown more clearly in FIGS. 2A and 2B, the mouth 21 of each of the cavities is surrounded by an insulation barrier strip 22. The material of strips 18 and 20 extends beyond the mouth 21 of each cavity and each of the strips 18 and 20 is electrically connected to separate conducting strips 24 for strip 18 and 26 for strip 20, each of which may have the same work function value as the associated barrier strip or may be made from a material that has a different conduction electron density here represented by the symbols $N_4$ for conductor 24 and $N_5$ for conductor 26.

The conduction electron densities of the materials for surfaces 14 and 16 and the strips 18, 20 and conductors 24 and 26 are such that the following relationship applies:

$$N_4 < N_2 < N_1 < N_3 < N_5$$

Alternatively, each of the conductors 24 and 26 can be of a material which ohmically contacts to strips 18 and 20 respectively, or can be fabricated with the same material as 18 and 20 respectively so that the following relationship applies:

$$\phi_2 < \phi_1 < \phi_3 \text{ and } \phi_4 \approx \phi_2; \phi_5 \approx \phi_3$$

The juxtaposition of strip 20 and the material of wall section 14 and 16 results in the formation of potential barriers 34 and 36 respectively, each of which exhibits non-linear current-voltage characteristics. The direction of forward bias results from strip 20 being negative with respect to either of the wall sections so that electrons flow from the strip into the particular wall section which is at the positive potential. There are similarly created potential barriers 32 and 30. The forward bias direction for these is for strip 18 being positive with respect to either wall section.

An incident electromagnetic wave impinging on a cavity 10 will resonate within the cavity structure, its energy absorbed or attenuated due to the finite impedence of the walls. The electric field of the wave will induce a wall current across potential barriers 30, 32 and 34 and 36. The strips 18 and 20 will act to rectify the wave-induced wall current and will deliver the rectified current to the conducting strips 24 and 26. Thus, a continuous cavity loop of conducting surfaces 14, 20, 16 and 18 acts contiguously as a full wave rectifier bridge circuit with direct current output to conducting strips 24 and 26.

As shown in FIG. 3, the various cavities of a transducing module 38 are connected in parallel to the conducting strips 24 and 26 where conductor 24 has a terminal 42 and conductor 26 has a terminal 40 across which the output power of the module can be delivered to an external load. It will be apparent to those skilled in this art that other combinations of series or parallel circuits can be arranged to achieve a desired voltage and current output for the foregoing and other arrangements of the cavities.

In a preferred embodiment, the surfaces 14 and 16 may be a metal such as aluminum with the strips 18 and 20 each being a semiconductor material of different types, one being a P-type, while the other being an N-type with the stated relationship between their conduction electron densities. In most cases, the metal work function, $\phi_N$, in this embodiment, would be greater than the semiconductor work function for the N-type, and less than the semiconductor work function for the P-type. Alternatively, the surfaces 14 and 16 may be a metal and the barrier strips 18 and 20 may also be a metal with the potential barriers 30–36 being an oxide of one of the metals, or an insulating material such as $SiO_2$. In this example, the metal work function of sections 14 and 16, about 4.25 electron volts for molybdenum, would be greater than the work function for metal strip 20, e.g., 4.08ev for aluminum, while being less than the work function of strip 18, e.g., 4.82 for gold. The width of metal oxide may be on the order of 100 angstroms.

Of particular importance is the correct selection of the size of the cavity. In order to efficently convert solar energy to electric current, the cells must convert radiation having a wavelength in the range of 0.30–2.0 microns, wherein is contained approximately 95% of the energy of the solar spectrum. The cavity dimensions should therefore enable each cavity to absorb and transduce throughout this range so that cavity dimensions on the order of a micron would be required. Thus, the surface area of the mouth of each cavity should be large enough to admit solar radiation having a wavelength as large as 2.0 microns while the base 28 of the cavity should have a surface area that is on the order of the square of the shortest wavelength in this range of the solar radiation spectrum. The depth of each cavity should then be on the order of several wavelengths of the center wavelength of the spectrum.

As an example, it is believed that the largest dimension of the mouth of each of the cavities should be no larger than five times the longest wavelength in any particular wavelength band of the solar radiation spectrum and no smaller than the longest wavelength. The area of the base of each cavity should be less than 10 times the square of the shortest wavelength in a particular band. The distance from the mouth to the base along the axis of each cavity should be less than 10 times the longest wavelength in the band but greater than one-quarter wavelength of the longest wavelength in the band. Such dimensions will give suitable latitude in manufacturing the modules and it will be obvious that as the dimensions of the mouth and base vary, the depth of each cavity will vary.

It will be readily appreciated that the volume enclosed by the cavities need not be a truncated cone, as illustrated, but may also be hemispherical or hemiellipsoidal.

Manufacture of such cavities can be accomplished by presently available ion milliing techniques in combination with X-ray lithography as well as other methods known in the art.

In view of the relatively small dimensions of the cavities, the resulting modules 38 need not be rigid. Indeed, the cavities can be formed by depositing a metal layer on a plastic film substrate 44 such as Mylar which need not be rigid. Also, the cavities can be formed on a glass substrate for applications where weight is not a critical factor. Also, the completed cavities can be filled with a transparent dielectric material as a protective layer. It will also be apparent that, when in use, the maximum transducing efficiency will be achieved where the modules extend transverse to the direction of propagation of the incident radiation.

While the foregoing embodiment shows the use of a pair of barrier strips 18 and 20, a single barrier strip 18 can be employed with the conducting strip 26 then connected electrically to the material of the walls 14 and 16. However, such an arrangement will provide a somewhat lower power output. Also, it is not necessary that the barrier strips 18 and 20 be located opposite one another in each cavity, although this arrangement may be more attractive from a manufacturing standpoint. Although the emphasis has been on conversion of solar radiation, it should be clear that the invention is not limited to converting these frequencies and in particular can be utilized in the infrared.

Having described the invention, it will be apparent that various modifications may be made therein without departing from the spirit and scope of the present invention as defined in the appended claims.

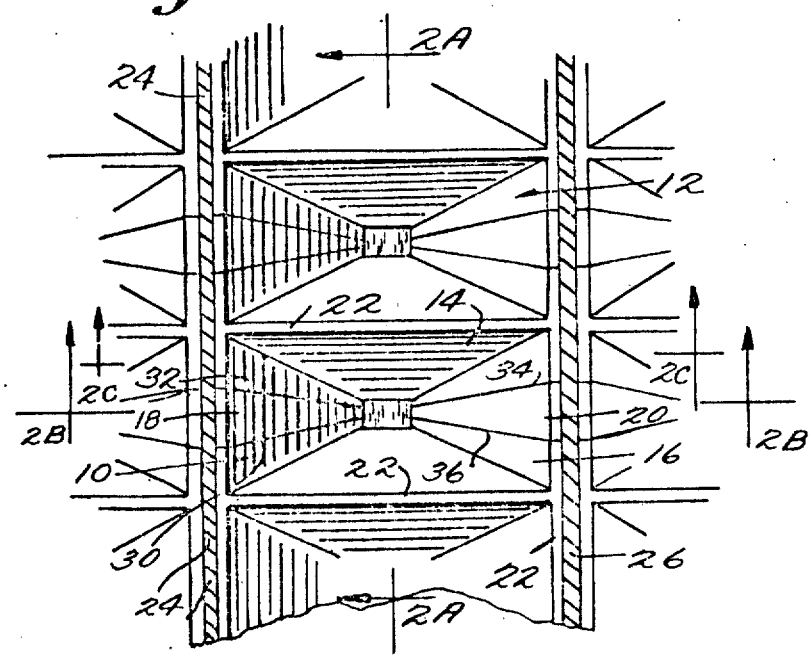

What is claimed is:

1. A radiation transducer module comprising a body having a plurality of cavities, each cavity having a mouth and a base, an interior surface extending from said mouth to said base and surrounding a central axis, said interior surface enclosing a progressively smaller area along said axis from said mouth to said base, said interior surface being made over a major portion of its area from a material having a conduction electron density $N_1$, said interior surface including a strip having opposite edges each defining a potential barrier, said strip having a conduction electron density $N_2$, said strip extending from said mouth to said base and being in contact with said interior surface along said edges of said strip, each said strip of each cavity being connected adjacent to each said mouth to a conductor having a conduction electron density $N_3$, each said interior surface being connected to a conductor having a conduction electron density $N_4$, where:

$$N_4 < N_1 < N_2 < N_3.$$

2. A radiation transducer module comprising a body having a plurality of cavities, each cavity having a mouth and a base, an interior surface extending from said mouth to said base and surrounding a central axis, said interior surface enclosing a progressively smaller area along said axis from said mouth to said base, said interior surface being made over a major portion of its area from a material having a conduction electron density $N_1$, said interior surface including a first strip having opposite edges each defining a potential barrier, said first strip having a conduction electron density $N_2$ and a second strip having opposite edges each defining a potential barrier, said second strip having a conduction electron density $N_3$, said strips extending from said mouth to said base and being spaced from one another, said first strip being connected adjacent said mouth to a conductor having a conduction electron density $N_4$ and said second strip being connected adjacent said mouth to a conductor having a conduction electron density $N_5$, where:

$$N_4 < N_2 < N_1 < N_3 < N_5.$$

3. The transducer module as claimed in claim 2, wherein said strips are located on substantially opposite sides of said axis of each cavity.

4. The transducer module as claimed in any one of claims 1, 2 or 3 wherein the largest dimension of the mouth of each cavity is no greater than five times the longest wavelength in any particular wavelength band of the solar radiation spectrum and the area of the base of each cavity is less than 10 times the square of the shortest wavelength in said wavelength band and where the distance from said mouth to said base along said axis is less than 10 times the longest wavelength in said band.

5. The transducer module as claimed in any one of claims 1, 2 or 3 wherein the largest dimension of the mouth of each cavity is 10.0 microns and the largest dimension of the base of each cavity is less than 2.0 microns, and where the distance from said mouth to said base along said axis is less than 10 microns.

6. The transducer module as claimed in claim 5 wherein the largest dimension of the base of each cavity is approximately zero.

7. The transducer module as claimed in any one of claims 1, 2 or 3 wherein said cavities are shaped as truncated pyramids.

8. The transducer module as claimed in claim 2 wherein said interior surface is one metal, said first strip is another metal and said second strip is a third metal, said first and second strips having opposite side edges with an oxide of one of said metals extending along each side edge of each of said strips.

9. The transducer module as claimed in claim 2 wherein said interior surface is a metal and said first strip is another metal and said second strip is a third metal and wherein, along the edges of each of said strips an insulating material is disposed between said interior surface and each said edge of said strips to define a potential barrier.

10. The transducer module as claimed in any one of claims 1 or 2 wherein said cavities are disposed on a flexible, non-conductive substrate.

11. The transducer module as claimed in claim 10 wherein said substrate is a polyethylene terephthalate.

12. The transducer module as claimed in claim 10 wherein said interior surface is molybdenum and one of said strips is aluminum and the other of said strips is gold and wherein a potential barrier is disposed between said strips and said interior surface in the form of an oxide of one of said metals.

13. The transducer module as claimed in any one of claims 1 or 2 wherein said cavities are disposed on a rigid substrate.

14. The transducer module as claimed in claim 13 wherein said rigid substrate is glass.

15. The transducer module as claimed in any one of claims 1 or 2 wherein said cavities are filled with a transparent dielectric material.

16. The transducer module as claimed in any one of claims 1 or 2 wherein said cavities are shaped as hemiellipsoids.

17. The transducer module as claimed in any one of claims 1 or 2 wherein said cavities are shaped as hemispheres.

18. A radiation transducer module comprising a body having a plurality of cavities, each cavity having a mouth and a base, an interior surface extending from said mouth to said base and surrounding a central axis, said interior surface enclosing a progressively smaller area along said axis from said mouth to said base, said interior surface including a first and a second potential barrier strip with said strips extending from said mouth to said base and being in contact with said interior surface along the edges of each said strip, said strips each being made from materials with different work functions $\phi_2$ and $\phi_3$, respectively, said interior surface being made over a major portion of its area from a material having a work function $\phi_1$, said first and second potential barrier strips being spaced from one another, said first strip being connected adjacent said mouth to a first conductor, said second strip being connected adjacent said mouth to a second conductor and with said conductors being electrically insulated from each other and where:

$$\phi_3 < \phi_1 < \phi_2.$$

19. The radiation transducer module claimed in claim 18 where said interior surface is made from metal of work function $\phi_1$ and where said first and second potential barrier strips are made from P-type and N-type semiconductors respectively with semiconductor work functions $\phi_2$ and $\phi_3$ respectively and where:

$$\phi_3 < \phi_1 < \phi_2.$$

20. The radiation transducer module claimed in claim 19 where said first conductor is a metal of work function greater than the semiconductor work function of said first barrier strip and where said second conductor is another metal of work function less than the semiconductor work function of said first barrier strip.

21. The radiation transducer module of claim 18 where one of said conductors is made from the same material as one of said potential barrier strips and the other conductor is made from the same material as said interior surface.

22. A radiation transducer module comprising a body having a plurality of cavities, each cavity having a mouth and a base, an interior surface extending from said mouth to said base and surrounding a central axis, said interior surface enclosing a progressively smaller area along said axis from said mouth to said base, said interior surface including a barrier strip having opposite edges, said interior surface being made over a major portion of its area from a material having a given work function while said barrier strip is made from a material having a different work function, said strip extending from said mouth to said base and being in contact with said interior surface along said edges of said strip, said strip of each cavity being connected adjacent to each said mouth to a first conductor, each said interior surface being connected to a second conductor where insulation means are provided to electrically insulate said conductors from each other.

23. The radiation transducer module as claimed in claim 22 wherein said first and second conductors are made from the same material as said barrier strip and said interior surface, respectively.

24. The radiation transducer module of claim 22 where said interior surface and said second conductor are metal of one work function and said potential barrier strip and said first conductor are made of another metal of different work function.

25. The radiation transducer module of claim 22 where said interior surface is metal of work function $\phi_1$ and said potential barrier strip is P-type semiconductor of semiconductor work function $\phi_2$ where: $\phi_1 < \phi_2$.

26. The radiation transducer module of claim 22 where said interior surface is metal of work function $\phi_1$ and said potential barrier strip is N-type semiconductor of semiconductor work function $\phi_2$ where: $\phi_2 < \phi_1$.

27. A radiation transducer module comprising a body having a plurality of cavities, each cavity having a mouth and a base, an interior surface extending from said mouth to said base and surrounding a central axis, said interior surface including a barrier strip having opposite edges, said interior surface being made over a major portion of its area from a material having a given work function while said barrier strip is made from a material having a different work function, said strip extending from said mouth to said base and being in contact with said interior surface along said edges of said strip, said strip of each cavity being connected adjacent to each said mouth to a first conductor, each said interior surface being connected to a second conductor where insulation means are provided to electrically insulate said conductors from each other.

* * * * *

UNITED STATES PATENT AND TRADEMARK OFFICE
CERTIFICATE OF CORRECTION

PATENT NO. : 4,251,679

DATED : February 17, 1981

INVENTOR(S) : Bryan J. Zwan

It is certified that error appears in the above—identified patent and that said Letters Patent is hereby corrected as shown below:

Figure 1 of the drawings should appear as per attached sheet.

Signed and Sealed this

Sixteenth Day of November 1982

[SEAL]

Attest:

Attesting Officer

GERALD J. MOSSINGHOFF

Commissioner of Patents and Trademarks